United States Patent
Majumder et al.

(10) Patent No.: US 9,403,115 B2
(45) Date of Patent: Aug. 2, 2016

(54) GRAPHITE OXIDE COATED PARTICULATE MATERIAL AND METHOD OF MAKING THEREOF

(75) Inventors: Mainak Majumder, Wheelers Hill (AU); Wei Gao, Houston, TX (US); Pulickel Madhavapanicker Ajayan, Houston, TX (US); Tharangattu Narayanan, Houston, TX (US); Bhabendra K. Pradhan, Marietta, GA (US)

(73) Assignees: WILLIAM MARSH RICE UNIVERSITY, Houston, TX (US); NANOHOLDINGS LLC, Rowaton, CT (US)

( * ) Notice: Subject to any disclaimer, the term of this patent is extended or adjusted under 35 U.S.C. 154(b) by 212 days.

(21) Appl. No.: 14/006,063

(22) PCT Filed: Mar. 18, 2011

(86) PCT No.: PCT/US2011/029090
§ 371 (c)(1),
(2), (4) Date: Sep. 18, 2013

(87) PCT Pub. No.: WO2012/128747
PCT Pub. Date: Sep. 27, 2012

(65) Prior Publication Data
US 2014/0011034 A1    Jan. 9, 2014

(51) Int. Cl.
*B32B 5/16* (2006.01)
*B05D 7/00* (2006.01)
*B01D 53/02* (2006.01)
*C01B 31/04* (2006.01)
(Continued)

(52) U.S. Cl.
CPC ............... *B01D 53/02* (2013.01); *B01J 20/103* (2013.01); *B01J 20/3236* (2013.01); *B01J 27/20* (2013.01); *C01B 31/043* (2013.01); *C02F 1/288* (2013.01); *C09K 8/805* (2013.01); *H05K 9/0075* (2013.01); *C02F 1/283* (2013.01); *C02F 2101/20* (2013.01); *Y10T 428/2991* (2015.01); *Y10T 428/2993* (2015.01); *Y10T 428/2996* (2015.01); *Y10T 428/2998* (2015.01)

(58) Field of Classification Search
CPC .. Y10T 428/2991; C23C 24/00; C23C 28/04; C01B 31/04; C01B 31/043
USPC .................. 428/403; 427/201, 212, 215, 222
See application file for complete search history.

(56) References Cited

U.S. PATENT DOCUMENTS

| | | |
|---|---|---|
| 4,001,468 A | 1/1977 | Skubon et al. |
| 4,796,701 A | 1/1989 | Hudson et al. |

(Continued)

OTHER PUBLICATIONS

Wang et al., Preparation and properties of poly(vinylidene fluoride) nanocomposites blended with graphene oxide coated silica hybrids, Express Polymer Lett. vol. 6, No. 4 (2012) 299-307.*

(Continued)

*Primary Examiner* — Holly Le
(74) *Attorney, Agent, or Firm* — Winstead PC

(57) ABSTRACT

A process for conversion of conventional sand granules (or other particulates) to a 'core-shell' adsorbent granules in which GO (or GO-f) coating imparts nano structural features on the surface of the sand granules (or other particulates). Such materials are useful in a variety of engineering applications such as water purification, catalysis, capacitors, proppants, casting, and magnetic shielding.

47 Claims, 17 Drawing Sheets

(51) Int. Cl.
*C09K 8/80* (2006.01)
*B01J 20/10* (2006.01)
*B01J 20/32* (2006.01)
*B01J 27/20* (2006.01)
*H05K 9/00* (2006.01)
*C02F 1/28* (2006.01)
*C02F 101/20* (2006.01)

(56) References Cited

U.S. PATENT DOCUMENTS

| | | |
|---|---|---|
| 2004/0142136 A1 | 7/2004 | Truog |
| 2010/0176351 A1 | 7/2010 | Ruoff et al. |
| 2010/0247892 A1* | 9/2010 | Lee et al. ............ 428/221 |

OTHER PUBLICATIONS

Gao et al, Engineered graphite oxide materials for application in water purification, ACS Appl. Mater. Interfaces 2011, 3, 1821-1826.*

International Preliminary Report on Patentability for PCT/US2011/029090, issued on Sep. 24, 2013.

International Search Report and Written Opinion for PCT/US2011/029090, mailed on May 5, 2011.

Dimitrakakis, G. K., et al., "Pillared Graphene: A New 3-D Network Nanostructure for Enhanced Hydrogen Storage," *Nano Letters* 2008, 8, (10), 3166-3170.

Hummers, W. S., et al., "Preparation of Graphitic Oxide," *Journal of the American Chemical Society*, 1958, 80, (6), 1339-1339.

Li, D., et al., "Processable aqueous dispersions of graphene nanosheets" *Nature Nanotechnology*, 2008, 3, (2), 101-105.

Gao, W., et al., "New insights into the structure and reduction of graphite oxide." *Nat Chem* 2009, 1, (5), 403-408.

Kim, J., et al., "Graphene Oxide Sheets at Interfaces," *Journal of the American Chemical Society*, 2010, 132, (23), 8180-8186.

Park, S., et al., "Chemical methods for the production of graphenes" *Nature Nanotechnology*, 2009, 4, (4), 217-224.

Chandra, V., et al., "Water-Dispersible Magnetite-Reduced Graphene Oxide Composites for Arsenic Removal," *ACS Nano*, 2010, 4, (7), 3979-3986.

Dreyer, D. R., et al., "Graphene Oxide: A Convenient Carbocatalyst for Facilitating Oxidation and Hydration Reactions," *Angewandte Chemie International Edition*, 2010, 49, (38), 6813-6816.

Feng, X. et al., "Functionalized Monolayers on Ordered Mesoporous Supports," *Science* 1997, 276, (5314), 923-926.

Zhu, Y., et al., "Covalent Functionalization of Surfactant-Wrapped Graphene Nanoribbons," *Chemistry of Materials* 2009, 21, (21), 5284-5291.

Lomeda, J. R., et al., "Diazonium Functionalization of Surfactant-Wrapped Chemically Converted Graphene Sheets," *Journal of the American Chemical Society*, 2008, 130, (48), 16201-16206.

Martin, S. W., et al., "Microstructures of Carbon Products," *Industrial and Engineering Chemistry*, 1958, 50, (1), 41-46.

Mohan, D., et al., "Kinetics of mercury adsorption from wastewater using activated carbon derived from fertilizer waste," *Colloids and Surfaces A: Physicochemical and Engineering Aspects*, 2000, 177, (2-3), 169-181.

Santos, A., et al., "Decolorization of Textile Dyes by Wet Oxidation Using Activated Carbon as Catalyst", *Industrial & Engineering Chemistry Research*, 2007, 46, (8), 2423-2427.

Smuleac, V., et al., "Polythiol-functionalized alumina membranes for mercury capture". *Journal of Membrane Science*, 2005, 251, (1-2), 169-178.

Stoller, M. D., et al., "Graphene-Based Ultracapacitors" *Nano Letters* 2008, 8, (10), 3498-3502.

* cited by examiner

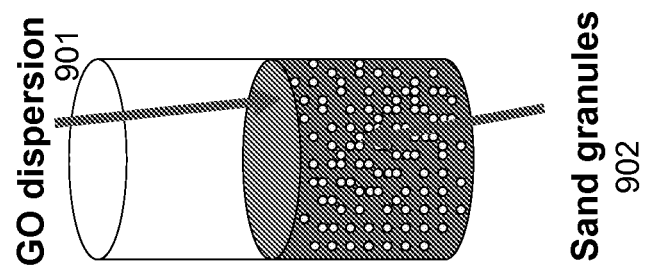

GRAPHITE OXIDE COATED PARTICULATE MATERIAL AND METHOD OF MAKING THEREOF

BACKGROUND

1. Field of the Invention

The present invention relates to graphite oxide coated particulate materials (such as graphite oxide coated sand), methods of manufacture of such materials, and uses thereof.

2. Background of the Invention

Graphene is a flat, $sp^2$ hybridized, two-dimensional (2D), honeycomb arrangement of carbon atoms with single carbon atom thickness. Graphene is expected to have far reaching consequences in not only understanding the fundamental aspects of these materials but also realizing real time applications. [Park 2009].

Graphene oxide is single to few layers of graphite that contains several oxygen rich functional groups rendering it soluble in water. Production of graphene through wet chemical oxidation of graphite to graphite oxide (GO) has become a popular method and a primary factor for an overwhelming interest in this new material. The oxygenated functional groups such as carboxylates, lactols and epoxides primarily lie at the edge of the nanographite sheets while the basal planes contain predominantly $sp^2$ hybridized graphene-domains. While the oxygen functional groups impart hydrophilicity, the graphene domains render hydrophobic character to these ampiphilic GO particles. [Kim 2010]. Consequently, GO is soluble in several polar and non-polar solvents including water but suffer from breakdown of electrical conductivity. [Li 2008]. The conductivity can be restored to a certain extent by thermal or chemical reduction of the oxygen functionalities, although such treatments also increase the hydrophobicity. [Gao 2009]. Nevertheless, the intrinsically large surface area of GO have found niche in electrochemical energy storage devices, hydrogen storage, and catalysis. [Stoller 2008; Dimitrakakis 2008; Dreyer 2010].

Historically, water purification technologies have utilized high surface area carbon materials in the form of activated carbon for decolorization and heavy metal ion retention. [Santos 2007; Mohan 2000]. The plethora of functional groups and the strong van der Waals interaction allows adsorption of heavy metal ions as well as organics. Therefore, they have found applications, among others, in water and air purification for heavy metal removal, trace organics, decolorization, and odor removal. Typically they are synthesized from waste materials by high temperature (1000-1700° C.) pyrolysis. It is also to be recognized that in most adsorption applications, they are used in the form of hundreds of micron or milli-meter scale granules; however, only the surface layer are typically utilized for these separation—the bulk of the material in the granules remains unutilized due to diffusion limitations. It is of interest to develop novel granular adsorbents which are inexpensive, does not require any high temperature process, yet are functional to the same extent as the commercial grade activated carbon.

Compared to these materials, GO is produced by room temperature soft-chemistry principles and is likely to be cost-efficient. Only recently has a report on magnetite-graphite hybrid materials for magnetically controlled speciation of arsenic from water been published. [Chandra 2010]. The possibility of harnessing this readily available and inexpensive material has been relatively unexplored.

SUMMARY OF THE INVENTION

The present invention relates to graphite oxide coated sand materials, methods of manufacture of such materials, and uses thereof.

In general, in one aspect, the invention features a method. The method includes dispersing graphite oxide in a liquid to form a liquid dispersion comprising graphite oxide colloids. The graphite oxide is dispersible in the liquid. The method further includes adding particulates to the liquid dispersion. The method further includes mixing the particulates with the graphite oxide colloids to form a graphite oxide coated particulate material.

Implementations of the invention can include one or more of the following features:

The liquid can be water.

The liquid can be an organic solvent.

The organic solvent can be DMF or ethanol.

The particulates can be sand, ceramic particles, polymeric particles, or combinations thereof.

The particulates can include sand. The graphite oxide coated material can be graphite oxide coated sand.

The particulates can include ceramic particles that are alumina, zirconia, alumino-silicates, glass, or combinations thereof.

The particulates can include polymeric particles that are polystyrene, poly-methyl methacrylate, polyurethane, or combinations thereof.

The graphite oxide can be unfunctionalized.

The graphite oxide can be functionalized.

The graphite oxide can be functionalized by covalently attaching thiol groups to the graphite oxide. The process to functionalize the graphite oxide does can exclude an intermediate chemical reduction step.

The graphite oxide coated particulate material made from the functionalized graphite oxide can have at least a six fold increase in absorption capacity as compared to a graphite oxide coated particulate material made from unfunctionalized graphite oxide.

The method of functionalization can include a diazonium grafting chemistry step.

At least some of the particulates can be coated with the graphite oxide.

At least about 75% of the particulates can be coated with the graphite oxide in the graphite oxide coated particulate material.

At least about 90% of the particulates can be coated with the graphite oxide in the graphite oxide coated particulate material.

At least about 99% of the particulates can be coated with the graphite oxide in the graphite oxide coated particulate material.

The particulates coated with the graphite oxide in the graphite oxide coated particulate material can have an average coating thickness in the range of around 10 nm to around 10 μm.

The particulates coated with the graphite oxide in the graphite oxide coated particulate material can have an average coating thickness in the range of around 0.15 μm to around 15 μm.

The particulates coated with the graphite oxide in the graphite oxide coated particulate material can have a substantially uniform coating thickness.

The step of dispersing graphite oxide in water to form a water dispersion can include a modified Hummers method.

The method can further include evaporating the liquid after the step of mixing the particulates with the graphite oxide colloids.

The graphite oxide coated particulate material can be utilized in a water purification application, an air purification application, catalysis application, a capacitor application, a proppant application, a casting application, a magnetic shielding application, or a combination thereof.

The graphite oxide coated particulate material can be utilized in a water purification application. The water purification application can remove heavy metals from the water being purified.

The heavy metals can be mercury, lead, selenium, or a combination thereof.

The graphite oxide coated particulate material can be utilized in an air purification application. The air purification can remove $CO_2$, mercury vapor, $H_2S$, or a combination thereof from the air being purified.

In general, in another aspect, the invention features a product that includes a plurality of graphite oxide coated particulates. The graphite oxide coated particulates in the products each include a core and a shell surrounding the core. The core includes a particulate. The shell includes graphite oxide.

Implementations of the invention can include one or more of the following features:

The particulate can be sand, a ceramic particle, a polymeric particle, or a combination thereof.

The particulate can be sand, and the graphite oxide coated material can be graphite oxide coated sand.

The particulate can include a ceramic particle that is alumina, zirconia, alumino-silicates, glass, or a combination thereof.

The particulate can include a polymeric particle that is polystyrene, poly-methyl methacrylate, polyurethane, or a combination thereof.

The graphite oxide can be unfunctionalized.

The graphite oxide can be functionalized.

The graphite oxide can have covalently attached thiol groups.

The graphite oxide coated particulates having functionalized graphite oxide can have at least a six fold increase in absorption capacity as compared to graphite oxide coated particulates having unfunctionalized graphite oxide.

At least about 75% of the product can be graphite oxide coated particulates.

At least about 90% of the product can be the graphite oxide coated particulates.

At least about 99% of the product can be the graphite oxide coated particulates.

The graphite oxide coated particulates in the product can have an average coating thickness in the range of around 10 nm to around 10 μm.

The graphite oxide coated particulates in the product have an average coating thickness in the range of around 0.15 μm to around 15 μm.

The graphite oxide coated particulates in the product have a substantially uniform coating thickness.

The product can be operable for use in a water purification application, an air purification application, a catalysis application, a capacitor application, a proppant application, a casting application, a magnetic shielding application, or a combination thereof.

The product can be operable for use in a water purification application. The water purification application can be operable for removing heavy metals from water.

The heavy metals can be mercury, lead, selenium, or a combination thereof.

The product can be operable for use in an air purification application. The air purification application can be operable for removing $CO_2$, mercury vapor, $H_2S$, and a combination thereof from the air.

The product can be made by the methods above to form a graphite oxide coated particulate material.

BRIEF DESCRIPTION OF THE DRAWINGS

For a detailed description of the preferred embodiments of the invention, reference will now be made to the accompanying drawings in which:

FIG. 8A is a $^1H-^{13}C$ CP spectrum. FIG. 8B is a the $^1H-^{13}C$ CP spectrum, but with a 50-μs dephasing interval preceding FID acquisition. FIG. 8C is as a direct $^{13}C$ pulse spectrum. FIG. 8D is as a direct $^{13}C$ pulse spectrum, but with a 50-μs dephasing interval preceding FID acquisition.

FIG. 9 is an idealized schematic of conversion of regular sand to the GO coated sand material.

DETAILED DESCRIPTION

Figures 1A, 1B:
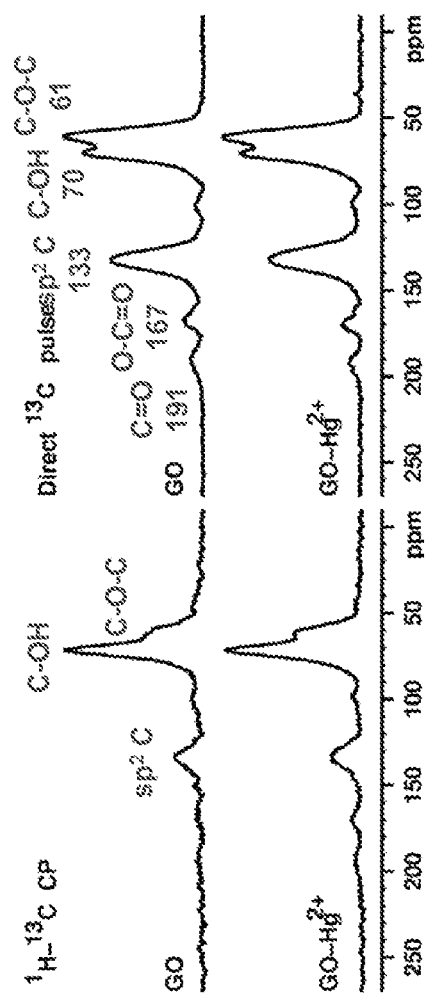
FIG. 1A reflects the MAS $^1H-^{13}C$ cross polarization spectra before the adsorption of $Hg^{2+}$ on GO.
FIG. 1B reflects the MAS direct $^{13}C$ pulse spectra before and after the adsorption of $Hg^{2+}$ on GO.

This invention concerns a new composition of material as well a novel process to achieve the new composition of material.

Applicant has discovered surface modification approaches and post-synthesis assembly steps that enables exploitation of GO as a novel material, such as for low-cost water purification processes. By covalently modifying graphite oxide nanosheets with complexing groups, embodiments of the present invention utilize a solution based method for coating silica particles with a graphitic carbon, which obviates the need for a high temperature process for producing the carbon layer. The silica particles can be in the form of mm-scale sand granules, or micron- to nano-scale silica particles.

A surface modification technique, such as those originally utilized for functionalization of chemically reduced and hydrophobic graphite nanosheets, can be employed to synthesize hydrophilic GO nanosheets containing covalently attached thiol groups. The modification can be affected through carbon-carbon attachment of benzene-thiol groups to the $sp^2$ lattice within the nanosheets, as confirmed by NMR spectroscopy. During this process, an intermediate chemical reduction step is not necessary (such as for diazonium chemistry). The GO nanosheets retain significant electron-rich $sp^2$ domains that can be utilized for grafting additional complexing groups. This modification resulted in around a six fold increase in adsorption capacity of mercuric ions.

For instance, several protocols, including the versatile diazonium grafting chemistry, are reported for chemical derivatization of graphene nanosheets; however, these approaches target the electrically conductive and relatively hydrophobic graphene end-product. [Lomeda 2008]. The low accessibility of water molecules in these hydrophobic materials reduce the ability of GO to sequester water soluble contaminants, such as heavy metals. Applicant has discovered that GO can be used to sequester water soluble contaminants, such as heavy metals, without compromising GO's inherent hydrophilicity. In one embodiment, this is achieved by covalent grafting of aromatic thiol groups on the remaining electron rich $sp^2$ carbon domains of graphite-oxide, without using the chemically reduced graphite intermediate.

After the wet chemistry steps, the water soluble GO or functionally modified GO can be assembled on sand (and/or other types of particulates) to create novel 'core-shell' granules that find use in filtration columns readily. The nanostructured GO coating significantly increases the retention of heavy metals and organic dye over the parent sand granules. Thus, suitably engineered graphite oxide, particularly derived from natural graphite, improves existing processes and spawn low-cost water purification technologies suited for the developing economies.

Sand—an abundant natural resource of earth—has been, and currently still is, widely used for processes of the magnitude of municipal water supplies to small domestic water filters, particularly as packed bed filters. History, affordability and the granular nature of sand that forms filter beds have popularized sand-filtration (SF). Early Indian and Greek writings dating back 6000 years refer to sand- and gravel-filtration as means to securing clean water and currently is a water purification process endorsed by the World Health Organization. [Inc 2001; Brikke 2003]. Of the two broad classifications of SF, fine-SF has higher retention of pathogens, organic matter, and heavy metal ions but has low throughput. Although the production rates are higher for the more popular coarse-SF, the absence of functionality and nanostructures limit pathogen, organics and heavy metal ions retention. [Brikke 2003].

U.S. Pat. No. 4,796,701 by Hudson et al. taught a method of coating sand particles with a polymer layer, which is converted to carbon by pyrolysis at high temperature. The drawbacks arose from the cost and the lack of graphitic carbon coating. Hummers et al. described a method for producing water soluble carbon particles from naturally occurring graphite using a combination of exfoliation of the graphite flakes and chemical oxidation. [Hummers 1958]. The solubility of these colloidal particles arose from the different polar functionality imparted on their surface. Gao et al. performed detailed mass spectrometry analysis of the different functional groups and confirmed the presence of several acidic functionalities. [Gao 2009].

The method of the present invention converts regular filtration sand into 'core-shell' graphite-oxide coated sand ("GO coated sand") granules by assembling liquid dispersible graphite-oxide and functionally modified graphite oxide on sand grains. The liquid generally used is water, accordingly, water will generally be the liquid referred to herein. However, other liquids in which graphite oxide is dispersible, such as an organic solvent (for example DMF or ethanol), can be utilized in embodiments of the invention. Two model contaminants, namely mercuric ions and a bulky dye molecule (Rhodamine B), have been utilized to quantify the effects of the nanostructured GO coating for improvements to the well-established coarse sand-filtration process.

Depending upon the use or other factors, materials other than silica particles can be utilized in the invention. For instance, ceramic particles (made from alumina, zirconia, alumino-silicates, or glass) or polymeric particles (made from polystyrene, poly-methyl methacrylate, or polyurethane) and other particles can be utilized in embodiments of the invention.

In some embodiments, the method of synthesis can include heating a physical mixture of sand and graphite-oxide dispersion at 150° C. for 12 hours to yield an adherent coating of thickness in the range of fraction of micron to tens of microns. The process does not involve any high temperature processes commonly involved with synthesis of other carbonaceous materials. Given that the coating thickness can be engineered to the level of requirements, and given that the source material, graphite, is cheap and abundantly mined, this new composition promises to be an extremely cheap and versatile material for a variety of purposes.

In some embodiments, benefits will be obtained by having a uniformity of the graphitic coating on the particles. Such coating uniformity can be obtained by varying the coating conditions. Process parameters include coating formation temperature, nature and concentration of graphite oxide in the solution, pre-treatment of the sand with functional groups etc. Furthermore, the surface properties of these granules can be engineered by simple chemical treatments, such as reduction by sodium boro hydride and hydrazine, or functionalization chemistry using diazonium salts, or carbodiimide chemistry.

Preparation of Graphite Oxide Dispersion

Graphite oxide (GO) nanoparticles are exfoliated and oxidized graphite nanoplatelets. [Hummers 1958]. Recent solid state $^{13}C$ NMR[4] has shown that about 60% of the carbon atoms in GO are $sp^3$ hybridized and oxidized, mostly in the form of alcohols and epoxides but also as lactols, while the remaining 40% of the carbon atoms remain $sp^2$ hybridized, mostly as unfunctionalized alkene or aromatic carbons but also as carbonyl groups in lactols, esters, acids, and ketones. The oxygen containing functional groups while imparting hydrophilicity can also exhibit limited complexing capacity with mercuric ions. [Zagorodni 2007].

The $^1H$—$^{13}C$ cross polarization (CP) experiment preferentially detects carbon atoms near protons, while the slower direct $^{13}C$ pulse experiment typically detects all the carbons. In the latter spectrum, the functional group responsible for each signal is shown, with the peak maximum indicated directly below. In principle, the $^{13}C$ signals arising from complexed functional groups would reflect the numerous isotopes of mercury. $^{13}C$ signals result from complexes with Hg nuclei with no spin $^{198}Hg$ (10.02% abundant), $^{200}Hg$ (23.13% abundant), $^{202}Hg$ (29.80% abundant), and $^{204}Hg$ (6.85% abundant)[1]. $^{13}C$ signals also result from complexes with spin-1/2 $^{199}Hg$ (16.84% abundant), which would be broadened because of two-bond and longer-range $^{13}C$—$^{199}Hg$ scalar coupling; MAS at 7.6 kHz is clearly fast enough to average the $^{13}C$—$^{199}Hg$ dipole-dipole interaction. [Barron 1982; Barron 11977; Wilson 1976; Kendrick 1980]. $^{13}$C signals also result from complexes with spin-3/2 $^{201}$Hg (13.22% abundant). However, the shape of these signals would be difficult to predict because the effect of the quadrupolar $^{201}$Hg nucleus on $^{13}$C is not obvious. [Kendrick 1980].

Figures 2, 3:
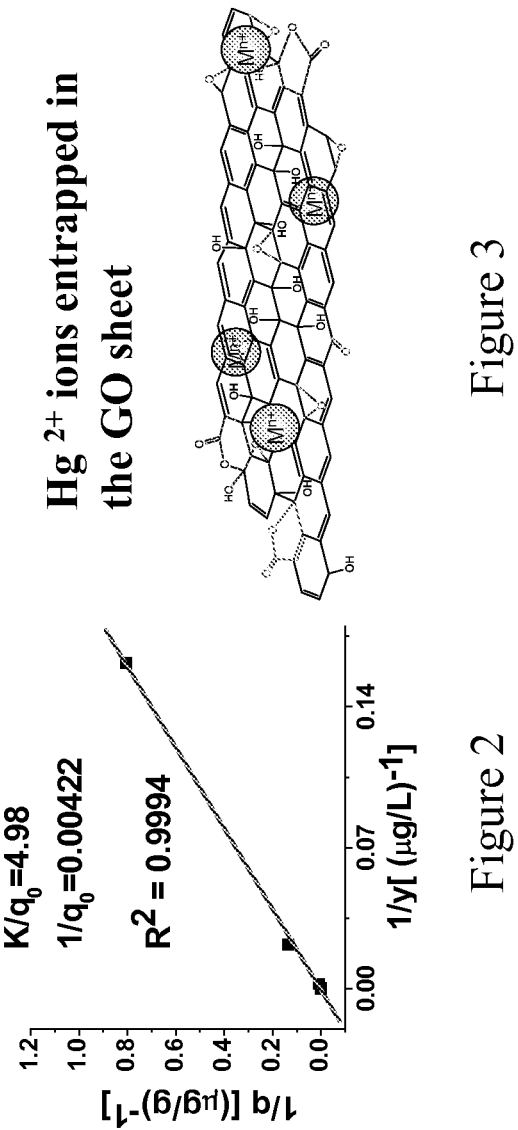
FIG. 2 reflects the adsorption isotherm of GO toward mercuric ion (q and y refer to mercuric concentration in adsorbent and feed solution, respectively).
FIG. 3 is a schematic of interaction between GO and mercuric ions in an embodiment of the present invention.

FIGS. 1A-1B show, respectively, magic angle spinning (MAS) $^{13}$C NMR spectra of GO before and after $Hg^{2+}$ adsorption. Small spectral changes occur upon complexation of $Hg^{2+}$, presumably because $Hg^{2+}$ is not directly bound to carbon in carboxylates and alkoxides and thus has only a modest influence on the $^{13}$C chemical shifts, as shown by the similarity of the carbonyl carbon chemical shifts in phenylmercuric benzoate and phenyl benzoate and by the similarity of the carbonyl and methyl carbon chemical shifts in mercuric acetate, cyclohexylmercuric, acetate phenylmercuric acetate, and acetic acid. [Wilson 1976; Nummert 2009; Barron 1982; Barron II 1977; Kalinowski 1988]. Experiments performed have indicated that the adsorption behavior of $Hg^{2+}$ ions on the native GO nanosheets can be represented by Langmuir type adsorption models (see FIGS. 2-3).

Figure 4:
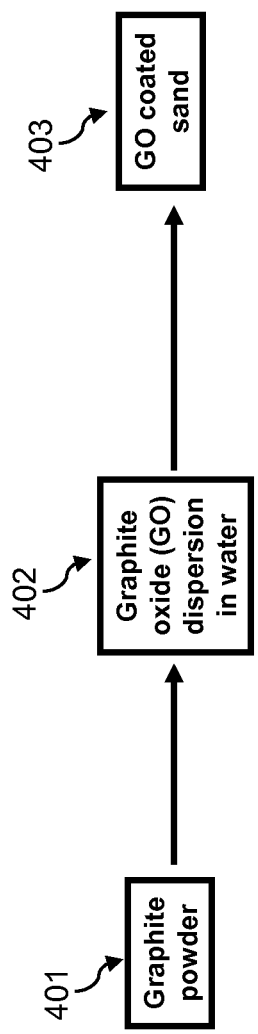
FIG. 4 is a flow chart and schematic illustration of the preparation of the GO coated sand material.

FIG. 4 is a flow chart and schematic illustration of the preparation of the GO coated sand material. As shown in FIG. 4, a graphite oxide dispersion 402 is formed from the graphite powder 401. Such process can include a modified Hummers method.

In an embodiment of the present invention, the graphite oxide was prepared according to the modified Hummers method that has been reported previously and utilized graphite powder purchased from Bay Carbon, Inc (SP-1 grade 325 mesh). Concentrated $H_2SO_4$ (50 ml), $K_2S_2O_8$ (10 g) and $P_2O_5$ (10 g) were mixed in a 2 L Erlenmeyer flask and heated to 80° C. with a hotplate. 12 g of graphite powder (purchased from Bay Carbon, Inc. SP-1 grade 325 mesh) was added to the mixture under strong magnetic stirring for 4.5 hours. After that, 2 L of deionized (DI) water was added to the suspension (initially, water was added very slowly to avoid large amount of heat from the dilution of $H_2SO_4$).

After dilution, the mixture was left overnight and then filtered through a 0.1 micron Teflon Millipore membrane. The filter cake was allowed to dry in air overnight. On the second day, the filter cake was slowly dispersed into 0.46 L concentrated $H_2SO_4$ in a 4 L Erlenmeyer flask in an ice bath with stirring. The temperature of the mixture was carefully controlled to not exceed 10° C. The dispersion was kept at 35° C. for 2 hours and then diluted with 900 ml of DI water. Water was initially added slowly to avoid rapid heating. During the whole process, the temperature was controlled below 50° C.

Subsequently 2.8 L of DI water was added over 2 hours with continuous stirring, giving a brownish dispersion. Immediately after finishing dilution, 50 ml of 30% $H_2O_2$ was slowly added to the dispersion, leading to tremendous bubbling, as well as an obvious color change from brown to bright yellow.

The mixture was left untouched for over two days and then filtered through a 0.1 micron Millipore Teflon membrane, and washed with 10% HCl and 5 L DI water sequentially. The final filter cake was left to dry in air and then kept in desiccators with $P_2O_5$.

The graphite oxide product produced was found to be easily dispersed in water by mild sonication.

Functionalized GO

In embodiment of the present invention, the GO can be functionalized. Covalent modification of porous materials with complexing groups such as thiol (SH) can significantly increase the adsorption efficiency. [Smuleac 2005]. The Tour group has investigated the grafting of aromatic diazonium compounds for covalent modification of reduced-graphite oxide (RGO). [Lomeda 2009]. But reduced-graphite oxide (RGO) is hydrophobic and has limited access to water molecules.

Figure 5:
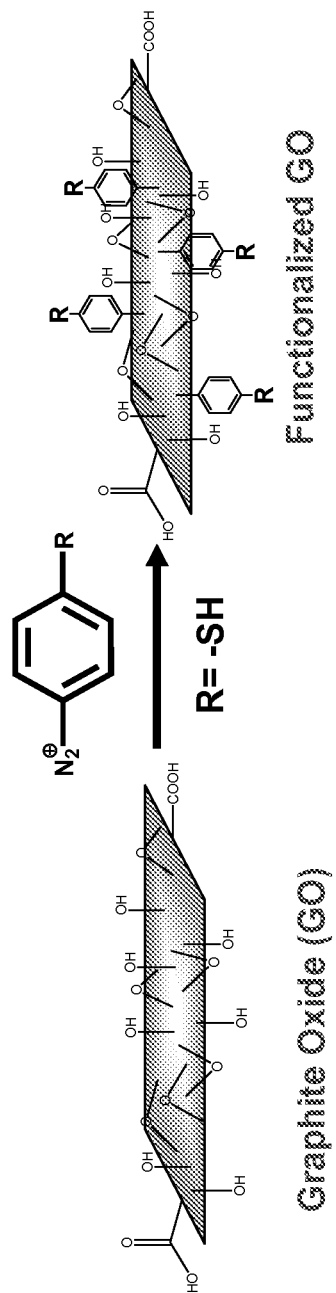
FIG. 5 is a schematic of functionalization chemistry on GO.
Figure 6:
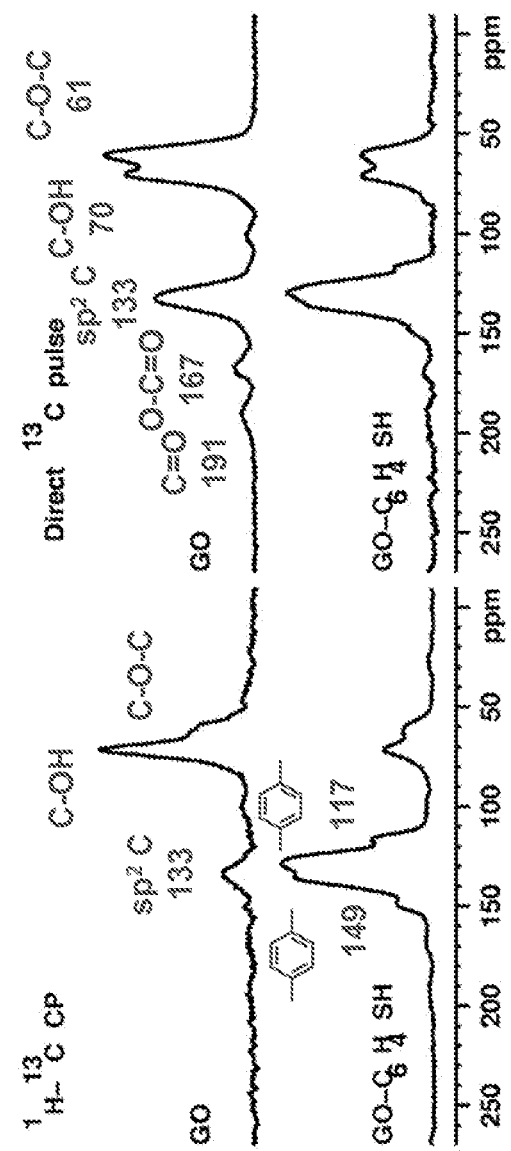
FIG. 6 is the corresponding NMR analysis of the functionalized product of FIG. 5.
Figure 7:
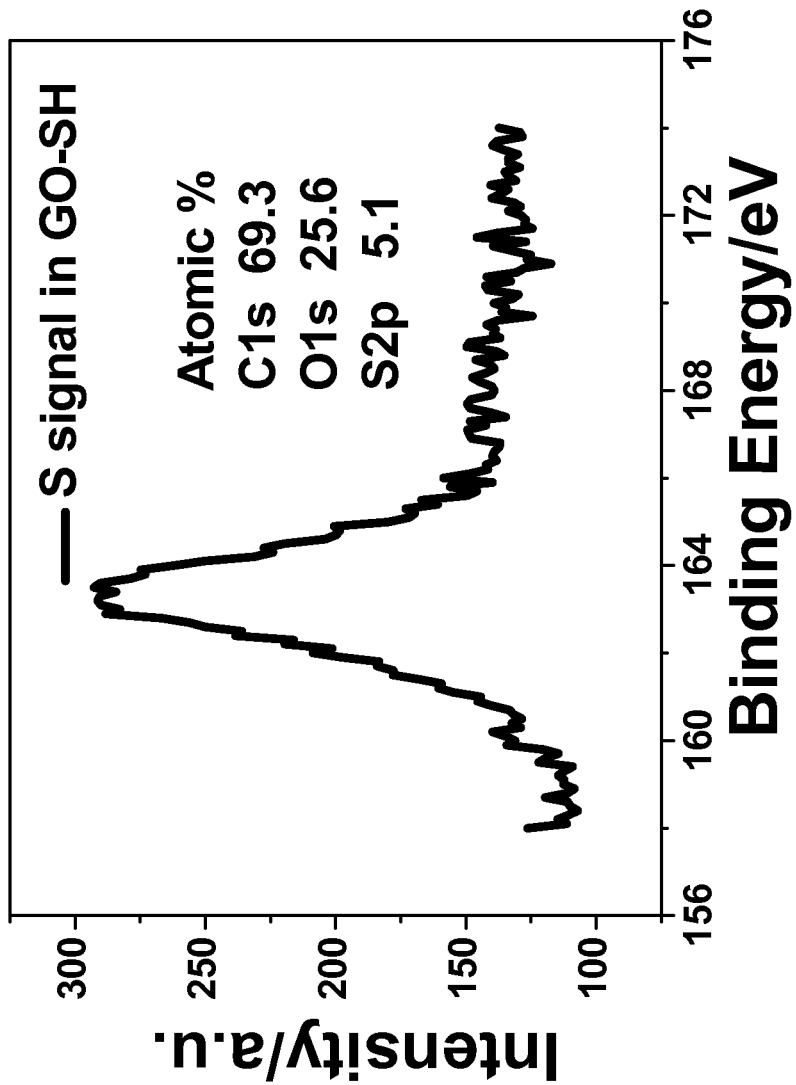
FIG. 7 is an X-ray photoelectron spectroscopy (XPS) analysis of a GO—SH sample.
Figure 8:
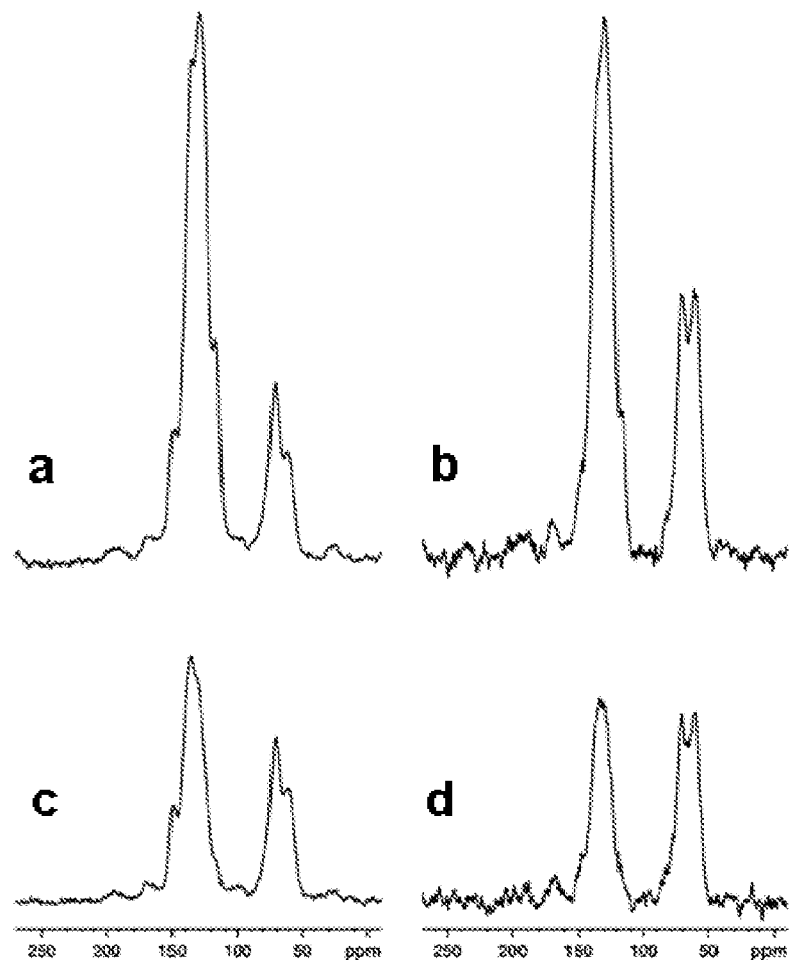
FIGS. 8A-8D are MAS $^{13}C$ NMR spectra of GO—$C_6H_4$—SH.

The diazonium grafting chemistry, nevertheless, provides a means to modify electron rich graphite domains by carbon attachment to the nanosheets. A direct diazonium grafting can be performed without the intermediate reduction step in order to retain the available hydrophilic groups (see FIG. 5) and to modify the remaining $sp^2$ carbon domains. The strong increase in the intensity of the aromatic/alkene carbon region (around 110-150 ppm) in the $^1H$—$^{13}C$ CP and direct $^{13}C$ pulse spectra of the product (GO—SH) in FIG. 6 showed that covalent modification of GO occurred. FIG. 7 is an X-ray photoelectron spectroscopy (XPS) analysis of the GO—SH product. As seen in FIG. 7, the carbon to sulfur atomic ratio is 13.5:1, indicating high degree of functionalization. As shown in FIG. 8A-8D, dipolar dephasing experiments showed a significant decrease in signal intensity in the aromatic/alkene region, which is attributed to the elimination of the aromatic C—H signals. In contrast, the signal intensity from the quaternary aliphatic carbon atoms in the alcohol/epoxy region was essentially unchanged.

In an embodiment of the present invention, a diazonium precursor (4-aminothiophenol) can be utilized. In this embodiment, 12 mmol 4-aminothiophenol was added to 15 ml 1N HCl, gently heated to 53° C. while stirring (solution 1). 12 mmol $NaNO_2$ was dissolved in 20 ml DI water, cooled down in an ice bath, and then added dropwise to the solution under constant stirring. The resulting solution was separated equally into two batches, and to each batch, a certain amount of GO (500 mg in 100 ml DI water) and reduced GO (RGO) (240 mg in 1 wt % aqueous sodium dodecylsulfate (SDS)) was added, and the reaction was kept in an ice bath with gentle stirring overnight. The product was separated by filtration, washed with acetone, ethanol and copious amount of DI water. The resulting filter cake was re-dispersed in DI water and dialyzed in Cellu Sep membrane (H1 high grade regenerated Cellulose Tubular Membrane, Pore size 5,000) against DI water for over a week.

Preparation of GO Coated Particulate Material

FIG. 4 shows an assembly process for conversion of conventional sand granules to a 'core-shell' adsorbent granules in which the GO and GO-f coating imparts nanostructural features on the surface of sand granules. The assembly process includes physical mixing of the water dispersible GO colloids in the GO dispersion 901 with sand granules 902 (as shown in FIG. 9), followed by a mild heat treatment that causes the nanosheets to adhere to each other over the sand surface, likely through van der Waals interaction.

As shown in FIG. 4, the graphite oxide dispersion 402 (with GO or GO-J) can then be used to form GO coated sand 403. In embodiments of the present invention, the core materials can be particles in addition to, or in place of, sand. For instance, the core particles can be sand, ceramic particles (such as made from alumina, zirconia, alumino-silicates, or glass), polymeric particles (such as made from polystyrene, poly-methyl methacrylate, or polyurethane) or a combination thereof.

In an embodiment of the present invention, Filpro-sand (obtained from US Silica Company) was used. The Filpro-sand was washed with 10% HCl before use. 10 gram of clean sand was put in a Petri dish, with 10 ml 0.35 wt % of GO/DI water dispersion. This mixture was heated up to 150° C. in a vacuum oven for two hours. Optionally, this process can be repeated to increase the GO-coating thickness on the sand.

Figures 10A, 10B:
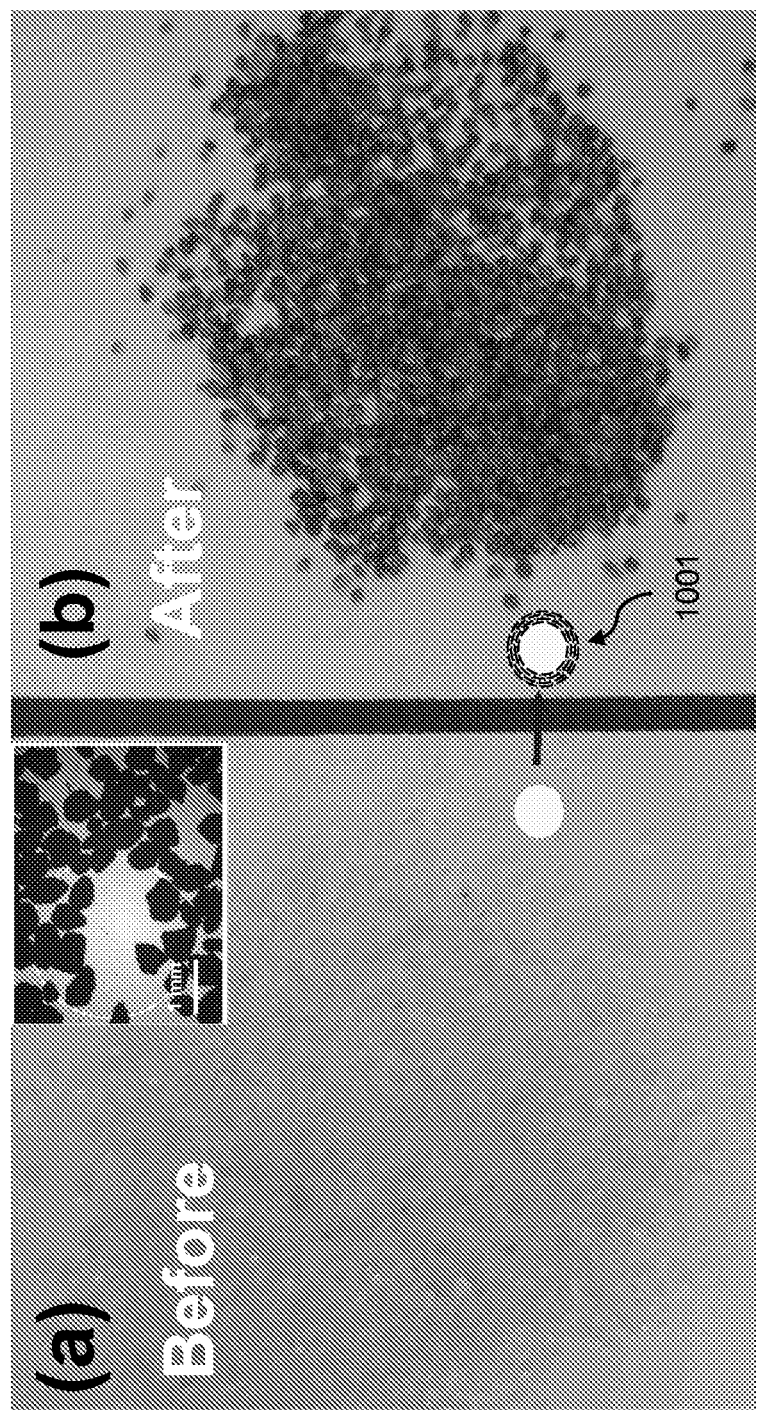
FIG. 10A is a photographic image of sand.
FIG. 10B is a photographic image of GO coated sand material.
Figure 11B:
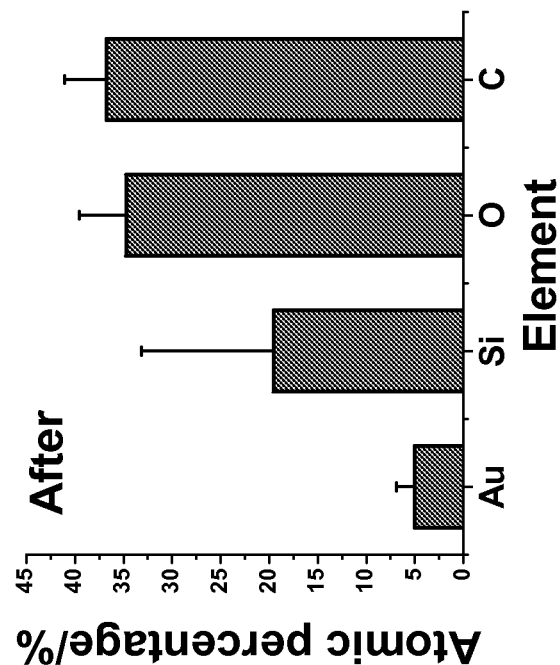
FIG. 11B is an EDAX analysis of GO coated sand material.
Figure 11A:
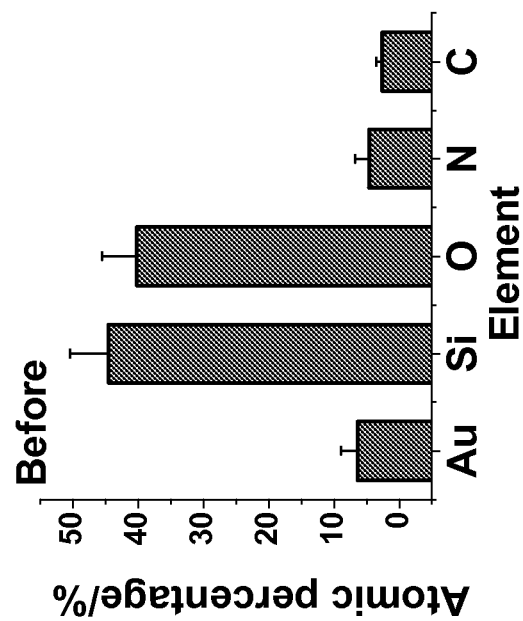
FIG. 11A is an EDAX analysis of sand.

As seen in FIGS. 10A-10B, there is the change in color from yellowish white (of the sand shown in FIG. 10A) to blackish grey (of the GO coated sand material shown in FIG. 10B). In inset 1001 of FIGS. 10A-10B, the idealized schematic is shown of the many-layer GO or GO-f coating and the resultant GO coated sand filtration granules. Because the small field-of-view of the SEM did not afford discernment of the coating on the mm-scale granules, and because of a lack of contrast between the sand and the heavily oxidized carbon particles, an EDAX analysis at different locations on the surface of the sand granules before and after coating (FIGS. 11A-11B, respectively). (SEM and EDAX data were obtained on Hitachi SEM S-5500, with 4.000-fold magnification and 7100 nA emission current). EDAX analysis from the surface of the grains clearly showed a significant increase in carbon content.

A typical elemental composition of the sand granules is compared to GO coated sand granules that demonstrated a large (around 30%) increase in carbon abundance and hence the presence of a carbon coating. Optimally, the coating can be conformal as idealized in inset 1001 of FIGS. 10A-10B. However, it is not required that all of the sand granules be coated; indeed, a typical process will likely coat a majority of the surface of individual sand granule.

Figure 12:
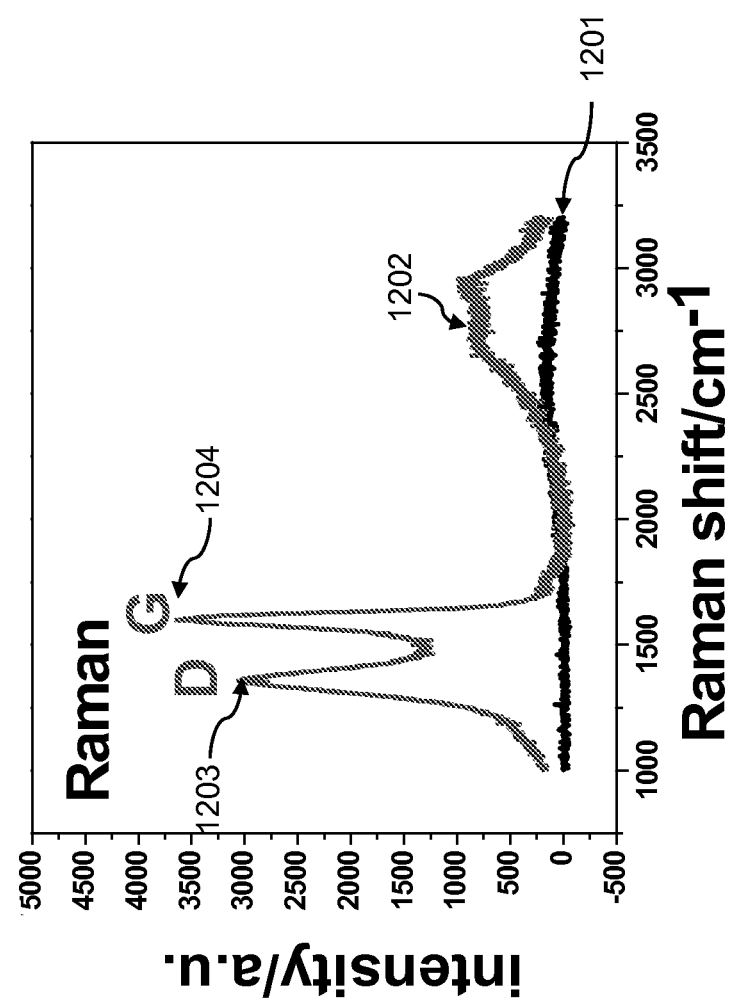
FIG. 12 is Raman spectra for the sand and GO coated sand material of FIG. 10A-10B.
Figure 13:
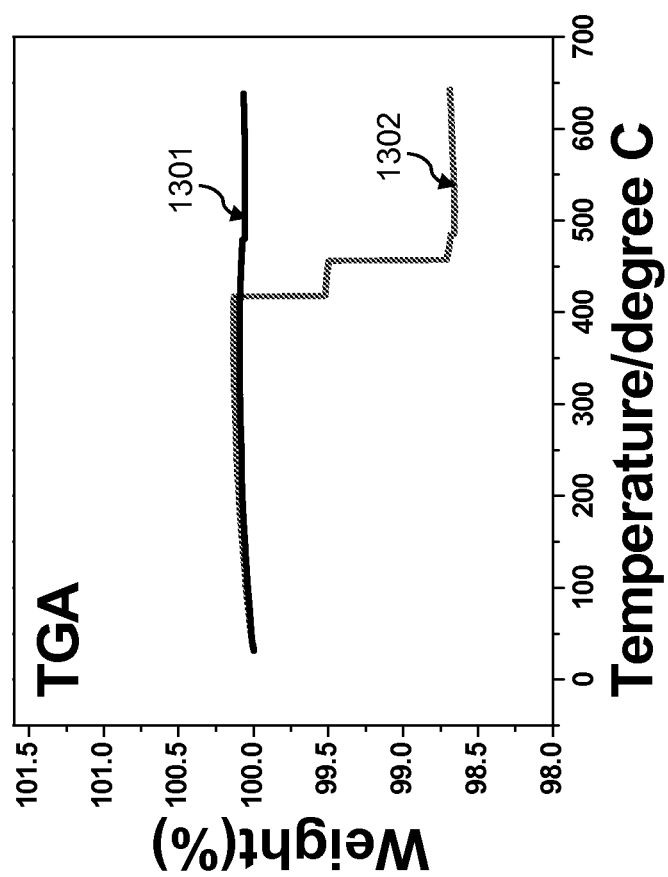
FIG. 13 is an estimation of the coating thickness from TGA data for the sand and GO coated sand material of FIG. 10A-10B.

This many-layer GO coating was additionally confirmed with Raman spectra (FIG. 12), and the thickness of this coating was estimated by TGA (FIG. 13). (TGA experiments were executed on the Q-600 Simultaneous TGA/DSC from TA Instruments under 100 ml/min Ar; Raman spectra were characterized with the Renishaw Raman instrument (514.5 nm Laser beam, 50% power, room temperature, solid samples on glass)).

Figure 14:
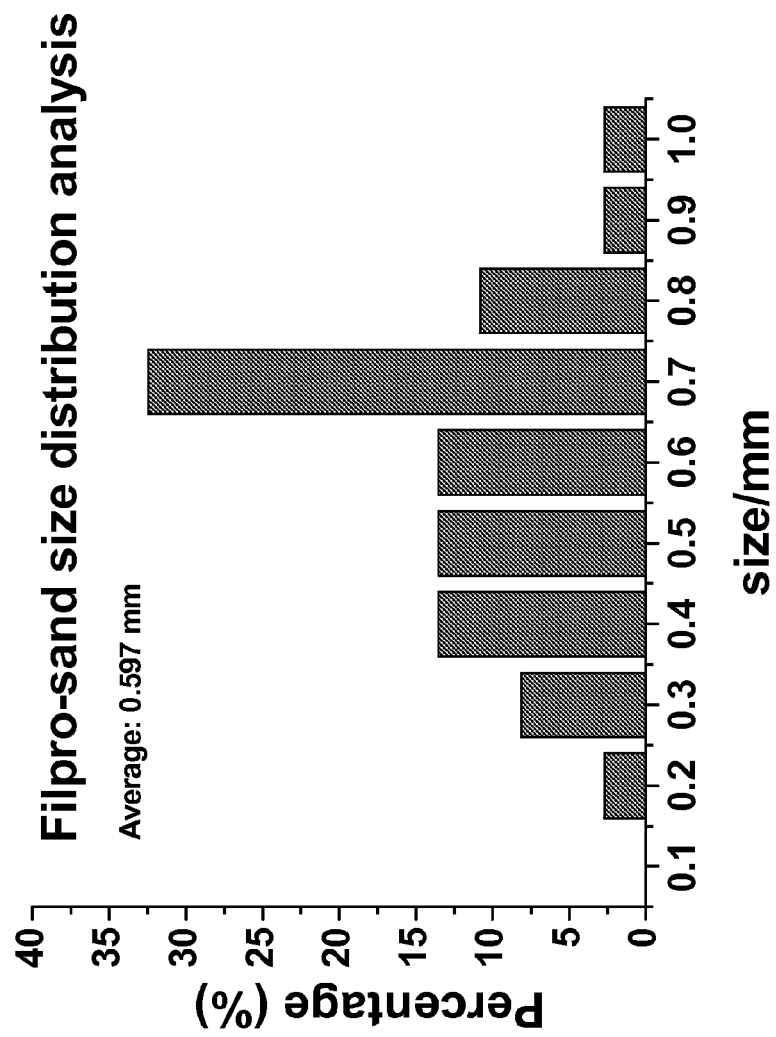
FIG. 14 is a Filpro-sand size distribution analysis of a GO coated sand material. (Mean size: 0.597 mm).

FIG. 12 is a Raman spectra for the sand (curve 1201) and GO coated sand material (curve 1202). FIG. 12 shows the for the GO coated sand material, prominent D (1359 cm$^{-1}$) peak 1203 and G (1598 cm$^{-1}$) peak 1204 were observed, while barely any features were obtained from pristine sand. These peaks are consistent with GO Raman data reported previously. [Gao 2009]. FIG. 13 is an estimation of the coating thickness from TGA data for the sand (curve 1301) and GO coated sand material (curve 1302). FIG. 13 shows typical TGA data for GO coated sand material showing a weight loss of ~1.5% contrasted with that of sand. The thickness can be estimated from this weight loss data, the size of the sand granules (measured)~597 μm (see FIG. 14)), density of sand (about 2 g/cm$^3$), and the density of GO (about 1.68 g/cm$^3$). [Balco 2003; Martin 1958].

The thickness of the GO coating can be adjusted by changing the concentration of GO solution or repeating of the vacuum heating process. For example, the GO coating could be from around 10 nm to around 10 μm, and, in some further embodiments, from around 0.15 μm to around 1.5 μm.

Batch Adsorption Tests on GO

Figure 15:
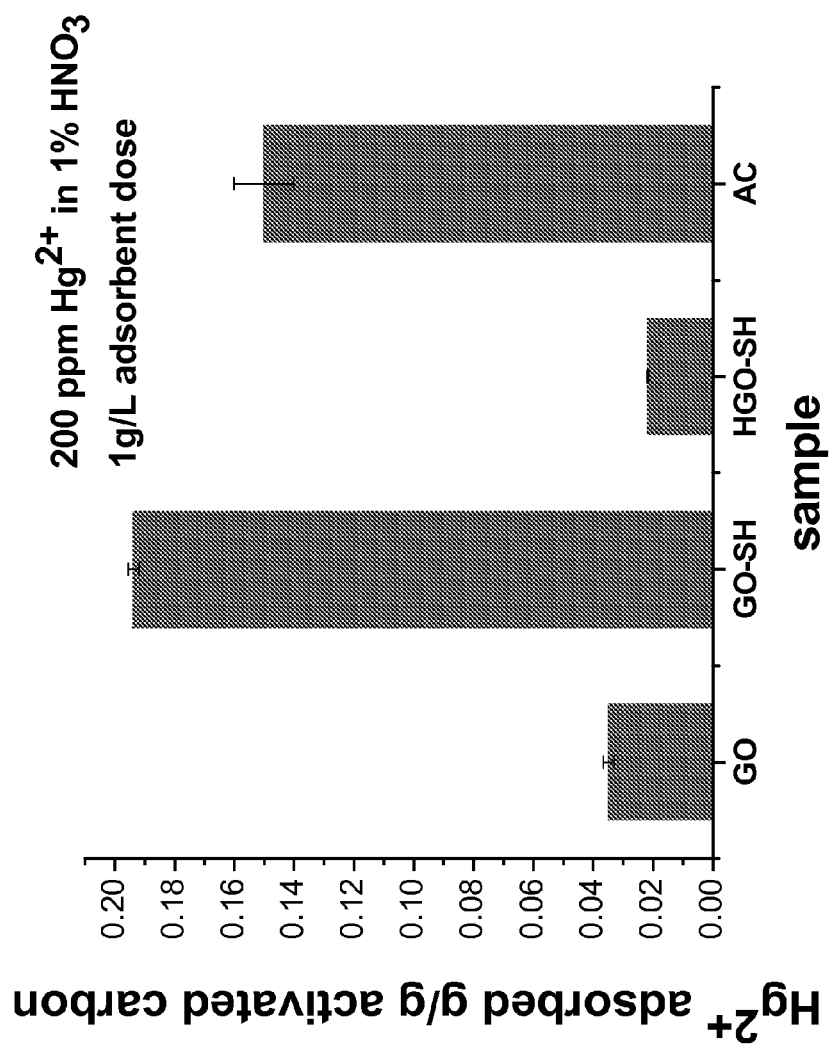
FIG. 15 is a graph showing the results of batch tests of the functionalized GO coated sand product for mercuric ion adsorption.

A comparison of the abilities of various GO and GO-f systems to speciate $Hg^{2+}$ is shown in FIG. 15. FIG. 15 is a graph showing the results of batch tests of a functionalized GO coated sand material for mercuric ion adsorption. The NMR spectra support the functionalization chemistry by the increased intensity in the aromatic region (around 130 ppm).

For these batch tests, about 20 mg GO was added to 20 mL of 200 ppm $Hg^{2+}$ solution while the pH of the solution was adjusted to 2.0. To facilitate thorough mixing the solution was mildly sonicated for 20 mins, then allowed to cool to room temperature and finally equilibrated for 24 hours at room temperature. The solution was separated from the solid by syringe filtration. The adsorption isotherm was obtained by changing the concentration of $Hg^{2+}$ solution in the range of 4 ppb-4000 ppm and repeating the experiment under similar conditions.

Adsorption experiments were undertaken with around 200 ppm $Hg^{2+}$ solution, acidic pH, and 1 gm/l of adsorbent dosage. While the RGO—SH (thiol groups attached to GO with the intermediate reduction step) in this embodiment of the present invention did not appear to improve over the non-functionalized GO, a significant increase (around 6 fold) was observed for the GO—SH material.

The $Hg^{2+}$ uptake capacity of GO was around 0.03 gm/gm of adsorbent, which can be increased to around 0.2 gm/gm for GO—SH. These results showed that this route of derivatization of GO created a novel hydrophilic material with enhanced heavy metal removal efficiency. Under similar conditions, Mohan et al. have reported an uptake of 0.15 gm of mercury/gm (AC in FIG. 15) of activated carbon formed by high temperature pyrolysis. [Mohan 2000]. These tailored GO-f materials have enhanced performance over activated carbon and their capacities are comparable to the self-assembled monolayer functionalized mesoporous silica (~0.05-0.3-gm/gm) discovered in the late 1990s and currently being commercialized. [Feng 1997]. Efficient adsorbent systems can thus be created using similar derivatization approaches to modify the $sp^2$ graphite domains of the GO nanosheets.

Uses Of GO Coated Particulate Material

The materials of the present invention have high active surface area, high temperature and pressure resistance, and low cost, which render them useful in several engineering applications, including:

Water purification. Sand, one of the most abundant materials, has traditionally been used for water treatment process primarily due to their granular nature that forms filter beds, and low cost. However, the absence of abundant functionality and nano-structures limit their use to just physical separation of impurities of large size. On the other hand, activated carbon has been used for removal of contaminants such as organic impurities and heavy metal ions. The carbon-coated sand therefore combines the cost-efficiency of sand with the functionality of activated carbon. Further, the absence of any high temperature process (>200° C.) and the abundance of naturally occurring graphite will make this new material competitive to activated carbon type materials. Such water purification techniques can be used to remove heavy meals, such as mercury, lead, selenium.

Air purification. The new material can also be used for air purification to remove gas, such as $CO_2$, mercury vapor, $H_2S$. This can be done using the material in an absorption column.

Catalyst supports. This new material can also find application as low-cost catalyst supports.

Capacitors. The graphene/graphene-oxide coated ceramic particles can also find applications as electrodes for supercapacitors. The advantage of the high-dielectric constant core and highly conductive shell can improve the capacitor performance significantly.

Proppants in oil drilling and oil production. Micron-scale ceramic particles have been used in well-bore formation such that these materials when packed in fissures allow the transport of gases and liquids efficiently. However, the conditions of pressure and temperature in these applications require extreme mechanical- and thermal-stress resistant properties. The graphitic coating around the ceramic particles will impart these properties to the ceramic particles.

Metallurgical Casting. A sand casting or a sand molded casting is a cast part produced by forming a mold from a sand mixture and pouring molten liquid metal into the cavity in the mold. The sand mold is cooled to allow solidification of the molten metal. The presence of the graphene-oxide/graphene coating on sand will increase the thermal conductivity and allow this casting process to become more efficient.

Magnetic Shielding. This new material can also find application in magnetic shielding applications, including electromagnetic interference shielding applications. The graphitization and electrical conductivity of GO coated particulate materials (such as GO coated sand) ensure the Electromagnetic Interference (EMI) Shielding property of the composite. The increasing demand for good EMI shielding materials and the flexibility of making concrete bricks from this novel particulate material make them unique for the construction of EMI shielded houses. Moreover, flexible polymer films based on GO coated particulate materials (such as GO coated sand) can also made by employing simple casting techniques and these composites can absorb EM waves in a range of frequency as well.

Figure 16A:
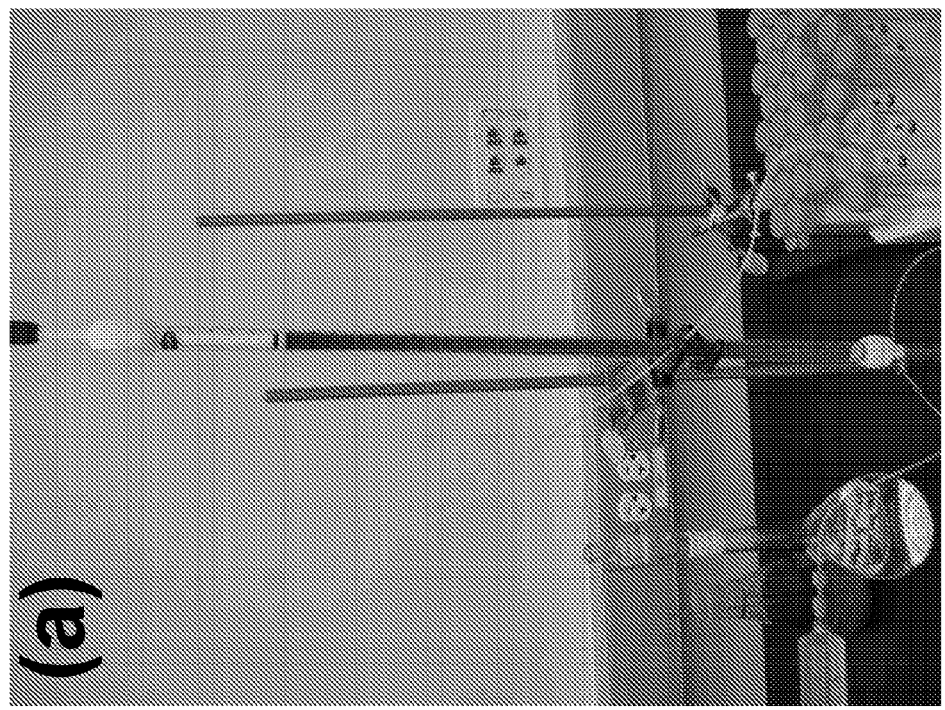
FIG. 16 is a schematic of a cavity perturbation method employed to test the efficiency of GO coated sand for electromagnetic shielding.
Figures 16B, 16C:
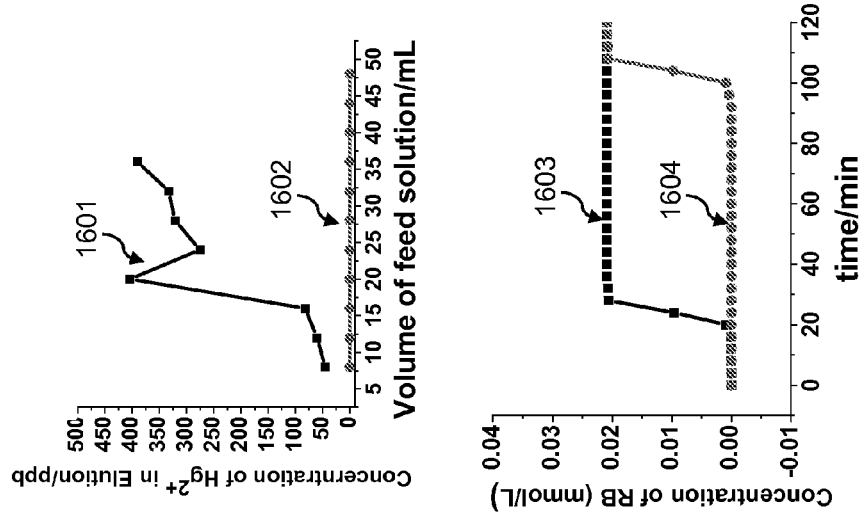

GO coated sand was tested for its application in electromagnetic shielding capacity. A cavity perturbation method, as shown in FIG. 16, was employed to test its efficiency.

Figure 17:
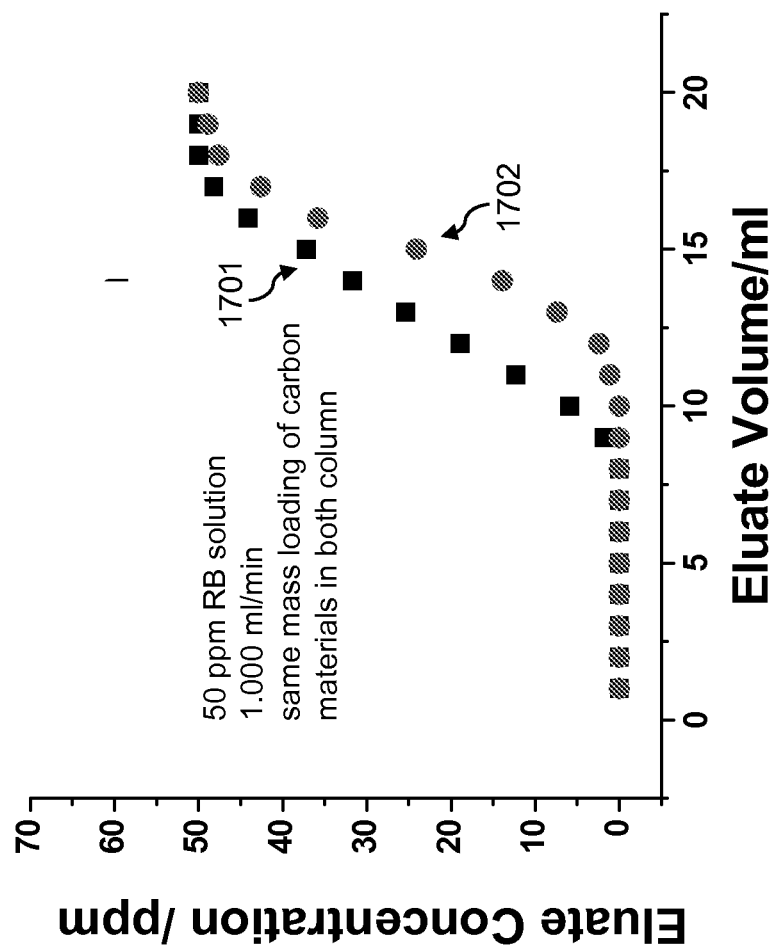
FIG. 17 is a graph showing the dielectric permittivity on sand and GO coated sand.

FIG. 17 is a graph showing the dielectric permittivity on sand (curve 1701) and GO coated sand (curve 1702). The microwave absorption measurements on GO coated sand indicated that a substantial absorption was coming from GO-coated sand, while pure sand had almost no absorption.

Column Test of GO Coated Particulate Material

For instance, packed bed columns are the preferred mode of operation in most water-purification systems owing to their simplicity and rapid kinetics. [Cussler 2003].

The novel GO-coated sand material of the present invention easily fills the filtration column and can be used in typical packed-bed experiments. For instance, two model contaminants: $Hg^{2+}$ (400 ppb in 1% $HNO_3$) and Rhodamine B dye (10 ppm (around 0.02 mmol L) in DI) were utilized to experimentally measure the adsorption breakthrough of GO coated sand and to compare it with sand.

For the column tests, a filtration column (6.6 mm dia.×400 mm long) was filled with GO coated sand, and the feed solution was flowed through the column at controlled flow rate, the eluted solution was collected at specific time intervals, and concentrations of all the eluates were determined by ICP-MS analysis for mercury ion or by UV-Vis spectrometer for Rhodamine B. For mercury, the feed solution was 400 ppb mercury solution in 1% nitric acid, and flow rate was 1.000 ml/min. For Rhodamine B, the feed solution was 10 ppm Rhodamine B in DI water, and flow rate was 1.000 ml/min.

The adsorption capacity of sand granules towards $Hg^{2+}$ was saturated within ten minutes of filtration, while the GO coated sand maintained the adsorption capacity for more than fifty minutes of fluid flow. The treated water had less than 1 ppb of $Hg^{2+}$. Similar results were also obtained for the dye molecule.

A comparison in the performance of GO coated sand with activated carbon granules (Darco, 400-800 micron) was also performed. A large dye molecule will have high diffusion resistance inside the granules. The GO coated sand granules with micron thick coating on about 600 micron sand granules performed comparably to the commercially available about 600 micron activated carbon granules.

This shows that the novel 'core-shell' adsorbent system of the present invention can sequester heavy metal or organic contaminants at five fold higher capacity than regular sand and its performance is comparable to some commercially available activated carbon.

The examples provided herein are to more fully illustrate some of the embodiments of the present invention. It should be appreciated by those of skill in the art that the techniques disclosed in the examples which follow represent techniques discovered by the inventors to function well in the practice of the invention, and thus can be considered to constitute exemplary modes for its practice. However, those of skill in the art should, in light of the present disclosure, appreciate that many changes can be made in the specific embodiments that are disclosed and still obtain a like or similar result without departing from the spirit and scope of the invention.

All patents and publications referenced herein are hereby incorporated by reference. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

REFERENCES

Balco, G., "Measuring the density of rock, sand, and till," *UW Cosmogenic Nuclide Lab Procedures.*, 2003 ("Balco 2003").

Barron, P. F., "Solid state $^{13}C$ NMR of mercuric(II) acetate: scalar $^{13}C$—$^{199}Hg$ coupling and crystal structure," *Journal of Organometallic Chemistry*, 1982, 236, (2) ("Barron 1982").

Barron, P. F., et al., "Variable Temperature C-13 and Hg-199 Nmr Examination of Cyclohexylmercury Systems," *Journal of Organometallic Chemistry*, 1977, 139, (3), 361-383 ("Barron 11977").

Barron, P. F., et al., "Oxythallation and oxymercuration: Carbon-13 NMR examination of some norbornene derivatives," *Journal of Organometallic Chemistry*, 1977, 132, (3), 351-358 ("Barron II 1977").

Brikke, F. B., *Linking technology choice with operation and maintenance in the context of community water supply and sanitation*, World Health Organization and IRC Water and Sanitation Centre, Geneva, Switzerland, 2003, 72-73 ("Brikke 2003").

Chandra, V., et al., "Water-Dispersible Magnetite-Reduced Graphene Oxide Composites for Arsenic Removal," *ACS Nano*, 2010, 4, (7), 3979-3986 ("Chandra 2010").

Cussler, E. L., *Diffusion: Mass Transfer in Fluid Systems*, Cambridge University Press, 2003 ("Cussler 2003").

Dimitrakakis, G. K., et al., "Pillared Graphene: A New 3-D Network Nanostructure for Enhanced Hydrogen Storage," *Nano Letters* 2008, 8, (10), 3166-3170 ("Dimitrakakis 2008").

Dreyer, D. R., et al., "Graphene Oxide: A Convenient Carbocatalyst for Facilitating Oxidation and Hydration Reactions," *Angewandte Chemie International Edition*, 2010, 49, (38), 6813-6816 ("Dreyer 2010").

Feng, X. et al., "Functionalized Monolayers on Ordered Mesoporous Supports," *Science* 1997, 276, (5314), 923-926 ("Feng 1997").

Gao, W., et al., "New insights into the structure and reduction of graphite oxide." *Nat Chem* 2009, 1, (5), 403-408 ("Gao 2009").

Hummers, W. S., et al., "Preparation of Graphitic Oxide," *Journal of the American Chemical Society,* 1958, 80, (6), 1339-1339 ("Hummers 1958").

Inc, H. E., *Criteria and Standards for Improved Potable Water Quality,* John Wiley & Sons: New York, 2nd ed., 2001, p. 1 ("Inc 2001").

Kalinowski, H. O., et al., "Carbon-13 *NMR Spectroscopy*," John Wiley & Sons, Ltd., 1988, p. 199 ("Kalinowski 1988").

Kendrick, et al., "Coupling between Rare Spins in Solids," *Journal of Magnetic Resonance,* 1980, 37, (3), 555-556 ("Kendrick 1980").

Kim, J., et al., "Graphene Oxide Sheets at Interfaces," *Journal of the American Chemical Society,* 2010, 132, (23), 8180-8186 ("Kim 2010").

Li, D., et al., "Processable aqueous dispersions of graphene nanosheets," *Nature Nanotechnology,* 2008, 3, (2), 101-105 ("Li 2008").

Lomeda 2008; Zhu, Y., et al., "Covalent Functionalization of Surfactant-Wrapped Graphene Nanoribbons," *Chemistry of Materials* 2009, 21, (21), 5284-5291 ("Lomeda 2009").

Lomeda, J. R., et al., "Diazonium Functionalization of Surfactant-Wrapped Chemically Converted Graphene Sheets," *Journal of the American Chemical Society,* 2008, 130, (48), 16201-16206 ("Lomeda 2008").

Martin, S. W., et al., "Microstructures of Carbon Products," *Industrial and Engineering Chemistry,* 1958, 50, (1), 41-46 ("Martin 1958").

Mohan, D., et al., "Kinetics of mercury adsorption from wastewater using activated carbon derived from fertilizer waste," *Colloids and Surfaces A: Physicochemical and Engineering Aspects,* 2000, 177, (2-3), 169-181 ("Mohan 2000").

Nummert, V., et al., "Effect of ortho substituents on carbonyl carbon $^{13}$C NMR chemical shifts in substituted phenyl benzoates," *Journal of Physical Organic Chemistry,* 2009, 22, (12), 1155-1165 ("Nummert 2009").

Santos, A., et al., "Decolorization of Textile Dyes by Wet Oxidation Using Activated Carbon as Catalyst, *Industrial & Engineering Chemistry Research,* 2007, 46, (8), 2423-2427 ("Santos 2007").

Smuleac, V., et al., "Polythiol-functionalized alumina membranes for mercury capture. *Journal of Membrane Science,* 2005, 251, (1-2), 169-178 ("Smuleac 2005").

Park, S., et al., "Chemical methods for the production of graphenes," *Nature Nanotechnology,* 2009, 4, (4), 217-224 ("Park 2009").

Stoller, M. D., et al., "Graphene-Based Ultracapacitors," *Nano Letters* 2008, 8, (10), 3498-3502 ("Stoller 2008").

Wilson, N. K., et al., "Carbon-13 nuclear magnetic resonance, $^{13}$C chemical shifts and $^{13}C^{199}$Hg coupling constants for some organomercury compounds," *Journal of Magnetic Resonance* (1969), 1976, 21, (3), 437-443 ("Wilson 1976").

Zagorodni, A. A., *Ion Exchange Materials: Properties and Applications,* 2007 ("Zagorodni 2007").

What is claimed is:

1. A method of forming a graphite oxide coated particulate material, wherein the method comprises the steps of:
    (a) dispersing graphite oxide in a liquid to form a liquid dispersion comprising graphite oxide colloids, wherein the graphite oxide is dispersible in the liquid;
    (b) adding particulates to the liquid dispersion of graphite oxide colloids; and
    (c) mixing the particulates with the liquid dispersion of the graphite oxide colloids to form the graphite oxide coated particulate material;

wherein the method excludes chemical reduction of the graphite oxide colloids, and
    wherein the formed graphite oxide coated particulate material comprises:
    (i) a core comprising the particulate, and
    (ii) a shell surrounding the core, wherein the shell comprises the graphite oxide.

2. The method of claim 1, wherein the liquid is water.

3. The method of claim 2, wherein the step of dispersing graphite oxide in water to form a water dispersion comprises a modified Hummers method.

4. The method of claim 1, wherein the liquid is an organic solvent.

5. The method of claim 4, wherein the organic solvent is DMF or ethanol.

6. The method of claim 1, wherein the particulates comprise a material selected from the group consisting of sand, ceramic particles, polymeric particles, and combinations thereof.

7. The method of claim 1, wherein the particulates comprise sand, and the graphite oxide coated material is graphite oxide coated sand.

8. The method of claim 1, wherein the particulates comprise ceramic particles from the group consisting of alumina, zirconia, alumino-silicates, glass, and combinations thereof.

9. The method of claim 1, wherein the particulates comprise polymeric particles from the group consisting of polystyrene, poly-methyl methacrylate, polyurethane, and combinations thereof.

10. The method of claim 1, wherein the graphite oxide is unfunctionalized.

11. The method of claim 1, wherein the graphite oxide is functionalized.

12. The method of claim 11, wherein the graphite oxide is functionalized by covalently attaching thiol groups to the graphite oxide.

13. The method of claim 11, wherein the process to functionalize the graphite oxide does not include an intermediate chemical reduction step.

14. The method of claim 11, wherein the graphite oxide coated particulate material made from the functionalized graphite oxide has at least a six fold increase in absorption capacity as compared to a graphite oxide coated particulate material made from unfunctionalized graphite oxide.

15. The method of claim 11, wherein the method of functionalization comprises a diazonium grafting chemistry step.

16. The method of claim 11, wherein at least some of the particulates are coated with the graphite oxide in the graphite oxide coated particulate material.

17. The method of claim 1, wherein at least about 75% of the particulates are coated with the graphite oxide in the graphite oxide coated particulate material.

18. The method of claim 1, wherein at least about 90% of the particulates are coated with the graphite oxide in the graphite oxide coated particulate material.

19. The method of claim 1, wherein at least about 99% of the particulates are coated with the graphite oxide in the graphite oxide coated particulate material.

20. The method of claim 1, wherein the particulates coated with the graphite oxide in the graphite oxide coated particulate material have an average coating thickness in the range of around 10 nm to around 10 μm.

21. The method of claim 1, wherein the particulates coated with the graphite oxide in the graphite oxide coated particulate material have an average coating thickness in the range of around 0.15 μm to around 15 μm.

22. The method of claim 1, wherein the particulates coated with the graphite oxide in the graphite oxide coated particulate material have a substantially uniform coating thickness.

23. The method of claim 1, further comprising evaporating the liquid after the step of mixing the particulates with the graphite oxide colloids.

24. The method of claim 1, wherein the graphite oxide coated particulate material is utilized in an application selected from the group consisting of water purification, air purification, catalysis, capacitor, proppant, casting, magnetic shielding, and combinations thereof.

25. The method of claim 24, wherein the application is water purification, and the water purification removes heavy metals from water being purified.

26. The method of claim 25, wherein the heavy metals are selected from the group consisting of mercury, lead, selenium, and combinations thereof.

27. The method of claim 25, wherein the application is air purification, and the air purification removes a gas selected from the group consisting of $CO_2$, mercury vapor, $H_2S$, and combinations thereof from air being purified.

28. A product comprising a plurality of graphite oxide coated particulates, wherein each of the graphite oxide coated particulates in the product comprise:
(a) a core comprising a particulate; and
(b) a shell surrounding the core, wherein the shell comprises graphite oxide.

29. The product of claim 28, wherein the particulate is a material selected from the group consisting of sand, ceramic particles, polymeric particles, and combinations thereof.

30. The product of claim 28, wherein the particulate comprises sand, and the graphite oxide coated material is graphite oxide coated sand.

31. The product of claim 28, wherein the particulate comprises ceramic particles from the group consisting of alumina, zirconia, alumino-silicates, glass, and combinations thereof.

32. The product of claim 28, wherein the particulate comprises polymeric particles from the group consisting of poly-styrene, poly-methyl methacrylate, polyurethane, and combinations thereof.

33. The product of claim 28, wherein the graphite oxide is unfunctionalized.

34. The product of claim 28, wherein the graphite oxide is functionalized.

35. The product of claim 34, wherein the graphite oxide has covalently attached thiol groups.

36. The product of claim 34, wherein the graphite oxide coated particulates having functionalized graphite oxide have at least a six fold increase in absorption capacity as compared to graphite oxide coated particulates having unfunctionalized graphite oxide.

37. The product of claim 28, wherein at least about 75% of the product comprises the graphite oxide coated particulates.

38. The product of claim 28, wherein at least about 90% of the product comprises the graphite oxide coated particulates.

39. The product of claim 28, wherein at least about 99% of the product comprises the graphite oxide coated particulates.

40. The product of claim 28, wherein the graphite oxide coated particulates in the product have an average coating thickness in the range of around 10 nm to around 10 µm.

41. The product of claim 28, wherein the graphite oxide coated particulates in the product have an average coating thickness in the range of around 0.15 µm to around 15 µm.

42. The product of claim 28, wherein the graphite oxide coated particulates in the product have a substantially uniform coating thickness.

43. The product of claim 28, wherein the product is operable for use in an application selected from the group consisting of water purification, air purification, catalysis, capacitor, proppant, casting, magnetic shielding, and combinations thereof.

44. The product of claim 43, wherein the application is water purification, and the product is operable for removing heavy metals from water.

45. The product of claim 44, wherein the heavy metals are selected from the group consisting of mercury, lead, selenium, and combinations thereof.

46. The product of claim 43, wherein the application is air purification, and the product is operable for removing $CO_2$, mercury vapor, $H_2S$, and combinations thereof from air.

47. The product of claim 28 made by the method of claim 1.

* * * * *